United States Patent
Dinker et al.

(10) Patent No.: US 9,881,109 B2
(45) Date of Patent: Jan. 30, 2018

(54) SIMULATING LIVE PRODUCTION LOAD

(71) Applicant: Ariba, Inc., Sunnyvale, CA (US)

(72) Inventors: Darpan Dinker, Sunnyvale, CA (US);
Kiran Bhumana, Sunnyvale, CA (US);
Sushant Prasad, Sunnyvale, CA (US);
Michael Karayev, Sunnyvale, CA (US); Vengarteswaran Chandrasekaran, Sunnyvale, CA (US);
Anup Katariya, Sunnyvale, CA (US)

(73) Assignee: Ariba, Inc., Sunnyvale, CA (US)

( * ) Notice: Subject to any disclaimer, the term of this patent is extended or adjusted under 35 U.S.C. 154(b) by 311 days.

(21) Appl. No.: 14/747,979

(22) Filed: Jun. 23, 2015

(65) Prior Publication Data

US 2016/0328462 A1    Nov. 10, 2016

Related U.S. Application Data

(60) Provisional application No. 62/156,716, filed on May 4, 2015.

(51) Int. Cl.
*G06F 17/30* (2006.01)
*G06F 17/50* (2006.01)

(52) U.S. Cl.
CPC ........ *G06F 17/5009* (2013.01); *G06F 17/303* (2013.01); *G06F 17/30427* (2013.01); *G06F 17/30545* (2013.01); *G06F 17/30575* (2013.01)

(58) Field of Classification Search
CPC ............ G06F 17/303; G06F 17/30595; G06F 17/30079; G06F 17/30557; G06F 17/30427; G06F 17/30575; G06F 17/30545; G06F 17/5009; H04L 47/125
See application file for complete search history.

(56) References Cited

U.S. PATENT DOCUMENTS

| | | | | |
|---|---|---|---|---|
| 5,732,247 A | * | 3/1998 | Dearth | G06F 17/5022 703/13 |
| 6,442,548 B1 | * | 8/2002 | Balabine | G06F 17/30067 |
| 7,917,607 B2 | * | 3/2011 | Becker | G06F 17/30386 707/610 |
| 8,191,040 B2 | * | 5/2012 | Hejlsberg | G06F 9/44 717/114 |

(Continued)

*Primary Examiner* — Kris Mackes
*Assistant Examiner* — Merilyn Nguyen
(74) *Attorney, Agent, or Firm* — Schwegman Lundberg & Woessner, P.A.

(57) ABSTRACT

In an example embodiment, data communications to a first database intercepted and divided based on tenant. For each tenant of multiple tenants sharing the first database, the commands to update the one or more records in the first database within the data communications corresponding to the tenant are translated into commands to update one or more records in a second database of a different type than the first database, the translated commands corresponding to the tenant are replayed against a copied version of the first database in the second database, and the performance of the second database in handling the translated commands during the replaying is tracked. Serialization and timely execution, among the translated commands corresponding to the tenant, of execution of the translated commands is maintained during the replaying and synchronization of execution of translated commands between multiple tenants is maintained.

20 Claims, 12 Drawing Sheets

(56) References Cited

U.S. PATENT DOCUMENTS

| | | | |
|---|---|---|---|
| 8,326,876 B1* | 12/2012 | Venkataraman | G06F 17/3056 707/759 |
| 9,384,202 B1* | 7/2016 | Tang | G06F 17/3056 |
| 9,525,731 B2* | 12/2016 | Plattner | H04L 67/1029 |
| 2007/0203910 A1* | 8/2007 | Ferguson | G06F 17/30575 |
| 2008/0162587 A1* | 7/2008 | Auer | G06F 8/60 |
| 2011/0029498 A1* | 2/2011 | Ferguson | G06F 17/30362 707/703 |
| 2011/0258178 A1* | 10/2011 | Eidson | G06F 17/30389 707/714 |
| 2011/0302135 A1* | 12/2011 | Prophete | G06F 17/30575 707/634 |
| 2011/0320439 A1* | 12/2011 | Gruschko | G06F 17/3041 707/722 |
| 2012/0173513 A1* | 7/2012 | Agrawal | G06F 17/30448 707/716 |
| 2015/0058376 A1* | 2/2015 | Soshin | G06F 17/30292 707/803 |
| 2016/0070771 A1* | 3/2016 | Vermeulen | G06F 17/30575 707/687 |
| 2016/0147859 A1* | 5/2016 | Lee | G06F 17/30371 707/615 |

\* cited by examiner

SIMULATING LIVE PRODUCTION LOAD

CROSS-REFERENCE TO RELATED APPLICATION

This application is a Non-Provisional of and claims the benefit of priority under 35 U.S.C. §119(e) from U.S. Provisional Application Ser. No. 62/156,716, entitled "SIMULATING LIVE PRODUCTION LOAD," filed on May 4, 2015 which is hereby incorporated by reference herein in its entirety.

TECHNICAL FIELD

This document generally relates to methods and systems for use with computer networks. More particularly, this document relates to the simulation of a live production load for the transitioning of data from one database to another.

BACKGROUND

For various reasons, companies may sometimes attempt to migrate their data and their customers' data from one type of database to another. This may be done for business reasons, such as attempting to migrate users of a competitor's database to the company's own in-house database, or for technical reasons, such as improving performance or lowering cost (or any combination thereof). Whatever the reasons, there are often technical challenges in migrating the data from one database type to another database type. One such challenge is that the data itself as well as the schema for the data may need to be modified to fit a completely different database type. For example, when migrating data from an ordinary relational database management system to an in-memory database management system it is necessary to convert the data from being row-based to being column-based. Additionally, when dealing with data of customers, it may be important to perform the migration without any downtime, allowing the migration to be transparent (or nearly transparent) to the customers to ensure an optimal customer experience. Furthermore, the workload on the new database may be different than the workload on the old database (for example, certain commands may wind up putting more strain on the new database than the old database, making resource management important). These aspects, in addition to the typical desires of wanting to ensure data is migrated accurately and efficiently, can be challenging, especially when dealing with large databases.

BRIEF DESCRIPTION OF DRAWINGS

The present disclosure is illustrated by way of example and not limitation in the following figures.

DETAILED DESCRIPTION

The description that follows includes illustrative systems, methods, techniques, instruction sequences, and computing machine program products that embody illustrative embodiments. In the following description, for purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques have not been shown in detail.

In an example embodiment, data is migrated from a first database to a second database through the use of a simulator. The simulator acts to simulate the workload and workload characteristics of the data on the second database. A copy of the first database is made and placed in the second database. Additionally, update events made on the first database are trapped in real time, shipped up to the clusters of the second database, and replayed against the second database, obtaining characteristics of how the second database handles the load. This acts to de-risk the migration concept to ensure reliability and the ability of the new database and resources devoted to the new database to handle the load.

In an example embodiment, the first database (the database being migrated from) is a relational database utilizing a row-oriented architecture. This relational database uses B-tree indexes for searches. In an example embodiment, the second database (the database being migrated to) is an in-memory database using a column-oriented architecture. The in-memory database does not use B-tree indexes for searches.

Figure 1:
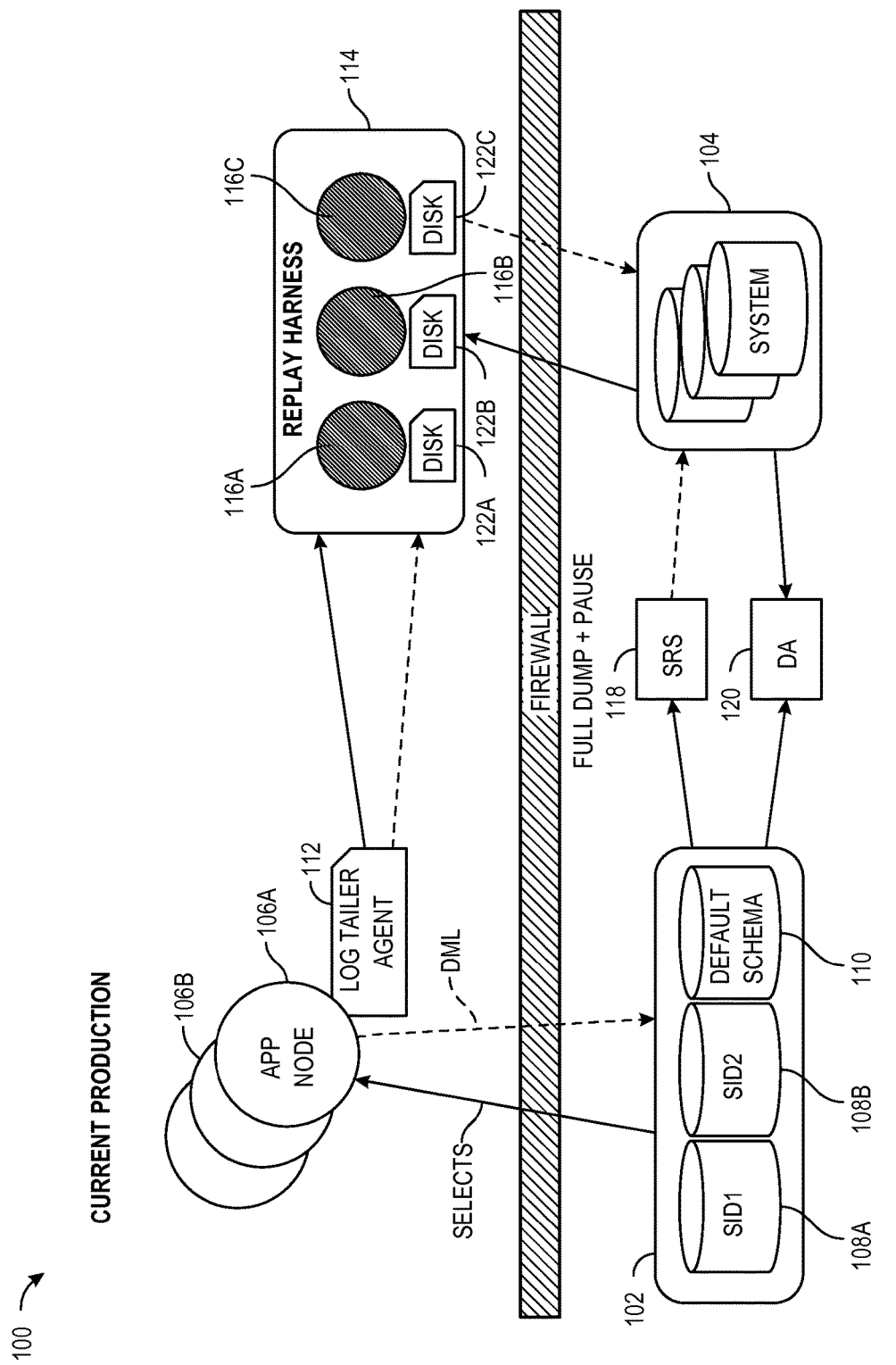
FIG. 1 is a block diagram illustrating a system, in accordance with an example embodiment, for migration of data from a first database 102 to a second database without downtime.

FIG. 1 is a block diagram illustrating a system 100, in accordance with an example embodiment, for migration of data from a first database 102 to a second database 104 without downtime. One or more applications 106A, 106B may interact with the first database 102, including performing access, searches, and updates on and to the first database 102. It should be noted that while two applications 106A, 106B are shown here, there may actually be any number of different applications 106A, 106B (as well as any number of instances of each of those different applications) interacting with the first database 102.

It should be noted that the first database 102 may actually comprise a number of different databases (or, at least, different instances of the same database), here labeled by system identification (SID) as SID1 108A and SID2 108B. Additionally, the first database 102 may comprise a default schema 110, which defines the schema for the databases SID1 108A, SID2 108B within the first database 102.

A log tailer agent 112 may act to intercept commands to the first database 102, trapping updates to the first database 102 and shipping them to a replay harness 114. In a sense this can be thought of as eavesdropping on the application(s) 106A, 106B and copying any commands to update the first database 102. The log tailer agent 112 may allow the update commands to continue to flow to the first database 102 as normal, but may log and send copies of these update commands to the replay harness 114.

In an example embodiment, the updates are trapped at the object-relational mapping (ORM) level. The ORM technique includes a mapping that creates a virtual object database that can be used within a programming language. In object-oriented programming, data management tasks act on object-oriented objects that are almost always non-scalar values; however, many database products such as those utilizing structured query language (SQL) can only store and manipulate scalar values. The ORM level then translates the logical representation of the objects into an atomized form that is capable of being stored in the database, while preserving the properties of the objects and their relationships so that they can be reloaded as objects when needed. As described above, in an example embodiment the trapping aspects provided by the log tailer agent 112 are performed at this ORM level, assuming one exists for the first database 102.

In an example embodiment, the log tailer agent 112 acts to intercept SQL commands, capturing them and storing them in a local file system, and uses log stream processing to push the update commands to the replay harness 114.

In an example embodiment, the log tailer agent 112 acts to intercept every connection creation and closing event from one of the applications 106A, 106B to the first database 102. Query parameters and query execution timings may be recorded. Additionally, the rows in the result set iterated by the application 106A, 106B and total elapsed time while iterating through the result set is also captured. The logging keeps encrypted values for fields that are encrypted in the database. An option may be provided to turn the query capture on or off, either for a whole cluster or for individual logs. Query logs can be kept separate from the main server logs.

In an example embodiment, the following events are captured by the log tailer agent 112:
  Connection retrieval (start time).
  Statement creation (start time and all the parameters).
  Statement execution time (start time, execution time, and also return value from the execution for write statements).
  Result set rows count.
  Total elapsed time for iterating through result set rows.
  Commit/Rollback.
  Connection release/close timing A full copy of the first database 102 can be ported over to the second database 104. This full copy includes the state of the first database 102. Since the data in the first database 102 is not static, however, such a port may be out of date soon after it is complete (or even as it is being copied), and thus some catch up may be required (as will be described in more detail below). Then, once the catch up is complete, the replay harness 114 acts to replay the update commands sent from the log tailer agent 112 on the second database, beginning from when the first database 102 was copied, to ensure consistency between the first database 102 and the second database 104. Additionally, by measuring performance data during this replay, the replay harness 114 is also able to detect how the second database 104 is handling the workload and determine any errors that may occur.

The replay harness 114 may measure load characteristics, and ensure consistency between the first database 102 and the second database 104 as soon as possible. However, the order in which the updates occur is only of secondary importance. For example, if update A then update B occur to the first database 102, it is desirable to have update A and update B also reflected in the second database 104 during the replay as soon as possible, but it is not necessary that update A occur prior to update B in the second database 104.

One challenge that occurs in achieving consistency as soon as possible is that there may be some implementations where multiple tenants share the first database 102. In an example embodiment, the goal of consistency is met by splitting the SQL commands reflecting updates to the first database 102 into multiple groups based on tenant. In one example embodiment, these SQL commands may actually be captured for each tenant independently of one another (i.e., using multiple log tailer agents 112), and thus pushed to the replay harness 114 independently. The ordering of the updates is maintained within each tenant's SQL updates, but not necessarily maintained among the different tenants.

In such an embodiment, each tenant may have at least one dedicated simulator process 116A, 116B, 116C. Thus, for example, the simulator process 116A could correspond to a first tenant, the simulator process 116B could correspond to a second tenant, and the simulator process 116C could correspond to a third tenant. Alternatively, for example, the simulator processes 116A and 11B could both correspond to a first tenant and the simulator process 116C could correspond to a second tenant.

Additionally, in an example embodiment, different simulator processes for the same tenant are kept in synchronization so that there is not a significant variation in completion of various tasks between the simulator processes for that tenant; however, no steps to synchronize between simulator processes of different tenants is made.

In an example embodiment, various techniques can be used to keep the different simulator processes for a particular tenant in synchronization. In one example embodiment, distributed coordination may be utilized. In this example embodiment, the simulator processes are distributed in coordination services. These distributed simulator processes are able to coordinate with each other through a shared hierarchical namespace. The namespace may include data registers that are kept in-memory. The coordination services provide strict ordering by stamping each update with a number that reflects its place in the order of all synchronized transactions. Updates may be processed by an agreement protocol where all updates are forwarded to a single server, called the leader. The other services may be labeled followers and receive message proposals from the leader and agree upon message delivery. The messaging layer takes care of replacing leaders on failures and syncing followers with leaders. An atomic messaging protocol can be used. When the leader receives an update, it calculates the state of the system when the update is to be applied and transforms this into a transaction that captures this new state.

In another example embodiment, automatic pause and resume is utilized to help maintain synchronization. This works by detecting laggard processes that are slower than the rest of the system. The other processes for that tenant are paused until all the processes hit a limit, and then all the processes are unpaused automatically. In another example embodiment, manual pause and resume is used. This can be useful where, for example, updates to the database itself need to be performed. A user is able to manually pause all the simulator processes for the tenant while the database is being updated, and then unpause them when the update is complete.

In an example embodiment, the individual SQL commands are stored in a separate log file for each node. Turning logging on or off can be controlled by two parameters. Both parameters are on for logging to occur. The first parameter is log category level. A new public category (called "slw-Collector") can be introduced, and this category can be set to the INFO level by default. The level for this log category is set to INFO or DEBUG for logging. The second parameter is a logging switch. The logging switch can be turned on or off from a screen in a controlling user interface. This switch can be turned on for a specific node or for the whole cluster and saved in the database.

SQL information can be collected into a separate object which will be created and attached to a ConnectionWrapper object, which is used by a Java Database Connectivity (JDBC) layer to provide a wrapper around the SQL connection. This object can collect the SQL information and write it out to the log file on specific triggers, such as closing the result set from a query, closing the statement, statement closer when autoCommit is true, transaction commit/rollback, and connection release/close.

Once the information is written out to the logs, it can be removed from the diagnostics object. In a graceful shutdown the logs are all captured, but in a non-graceful shutdown some events may be lost that are in the buffer or event queue.

In an example embodiment, a ResultSet object is wrapped by an application class to capture the logging information about the result set traversal. The number of rows traversed and total elapsed time during the result set traversal can be captured. Within the result set, the performance of individual column retrieval need not be tracked.

Binary Large Object (Blob) and Character Large Object (Clob) data need not be written out to a log file. Rather, the length of the Blob/Clob can be written to the log file. On the replay side this length is used to create some dummy data to be added to the second database 104. In one example embodiment, to make sure the second database 104 does not optimize the Blob column data, the system ensures that the dummy data is random data picked up while executing the SQL on the replay harness.

In an example embodiment, events may be captured in a SQL collector for each statement and prepared statement. This object is created when a JDBC connection is created and stays attached to the connection until the connection is closed. The captured statements can be flushed out based on the following triggers:

TABLE 1

When auto commit is false on the JDBC connection.

| Statement execution sequence | Event trigger |
| --- | --- |
| Read stmt | On result set close or statement close or connection close |
| Update stmt | On commit or rollback |
| Update stmt, Read stmt, Update stmt, . . . | On commit or rollback |
| Update stmt, Update stmt, . . . | On commit or rollback |

TABLE 2

When auto commit is true on the JDBC connection.

| Statement execution sequence | Event trigger |
| --- | --- |
| Read stmt | On result set close or statement close or connection close |
| Update stmt | On statement close |
| Update stmt, Read stmt, Update stmt, . . . | Each statement is flushed independently on statement close. |
| Update stmt, Update stmt, . . . | Each statement is flushed independently on statement close. |

In some example embodiments, a read statement in the first database 102 may not start any new transactions but a read statement in the second database 104 may. To handle this, the replay harness 114 can also log an empty commit/rollback event when the JDBC connection is committed or rolled back. The event allows the replay harness 114 to close the transaction on the connection on the second database 104 side.

Figure 2:
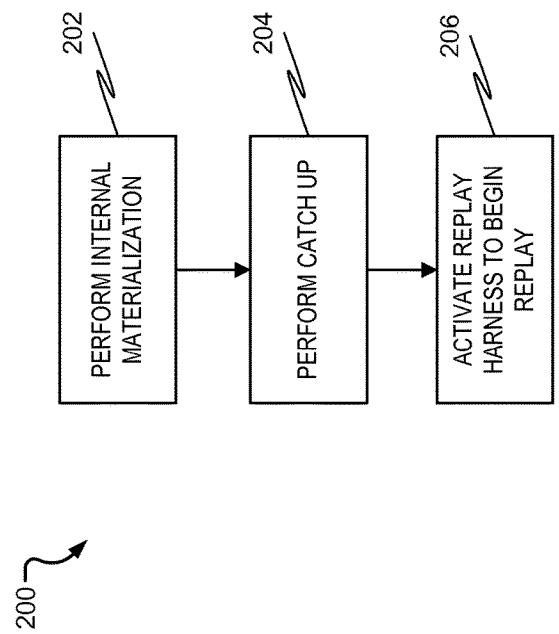
FIG. 2 is a flow diagram illustrating a method, in accordance with an example embodiment, for copying a first database to a second database.

As described earlier, when copying over the first database 102 to the second database 104, there are multiple steps involved. FIG. 2 is a flow diagram illustrating a method 200, in accordance with an example embodiment, for copying a first database 102 to a second database 104. At operation 202, internal materialization is performed. The most recent version of the data of the first database 102, along with state information and schema information of the first database 102, is ported over to the second database 104. At operation 204, catch up is performed. The second database 104 is made consistent with the first database 102 to catch items that may have changed while the internal materialization was occurring. At operation 206, the replay harness 114 is activated to begin the replay. In an example embodiment, a replication service (118 in FIG. 1) may be used for the first two steps (internal materialization at operation 202 and catch up at operation 204).

In an example embodiment, the third step (operation 206) involves setting a point in time when the replication service may stop the internal materialization and catch up and the replay harness 114 may take over to begin the simulation. The updates are then picked up from the individual replay processes.

Referring back to FIG. 1, a data assurance (DA) tool 120 may be used to determine whether the replicated data is in a good state. As such, the DA tool 120 may work hand-in-hand with the replication service 118 to ensure that the replication is proceeding smoothly. In an example embodiment, this may include measuring various performance data and comparing plots of graphs of the performance data. If the various graphs are converging (or, at least, not diverging), then the replication is proceeding smoothly. In a moving target such as a dynamic database, the differences between the databases keep moving. As long as these differences are not increasing (e.g., are constant or diminishing), then the replication is proceeding smoothly. Additionally, it may be important to determine whether the errors that are occurring are repeating or new errors each time (new errors are better, as repeating errors may signal an inherent problem in the replication process). Errors may include, for example, mismatches of data between the first database 102 and the second database 104.

The replay harness 114 may measure the various performances of the simulator processes 116A-116C and store this information in corresponding log files 122A-122C, which can later be analyzed. In another example embodiment, a dashboard may be used to analyze the performance data in real time.

Figure 3:
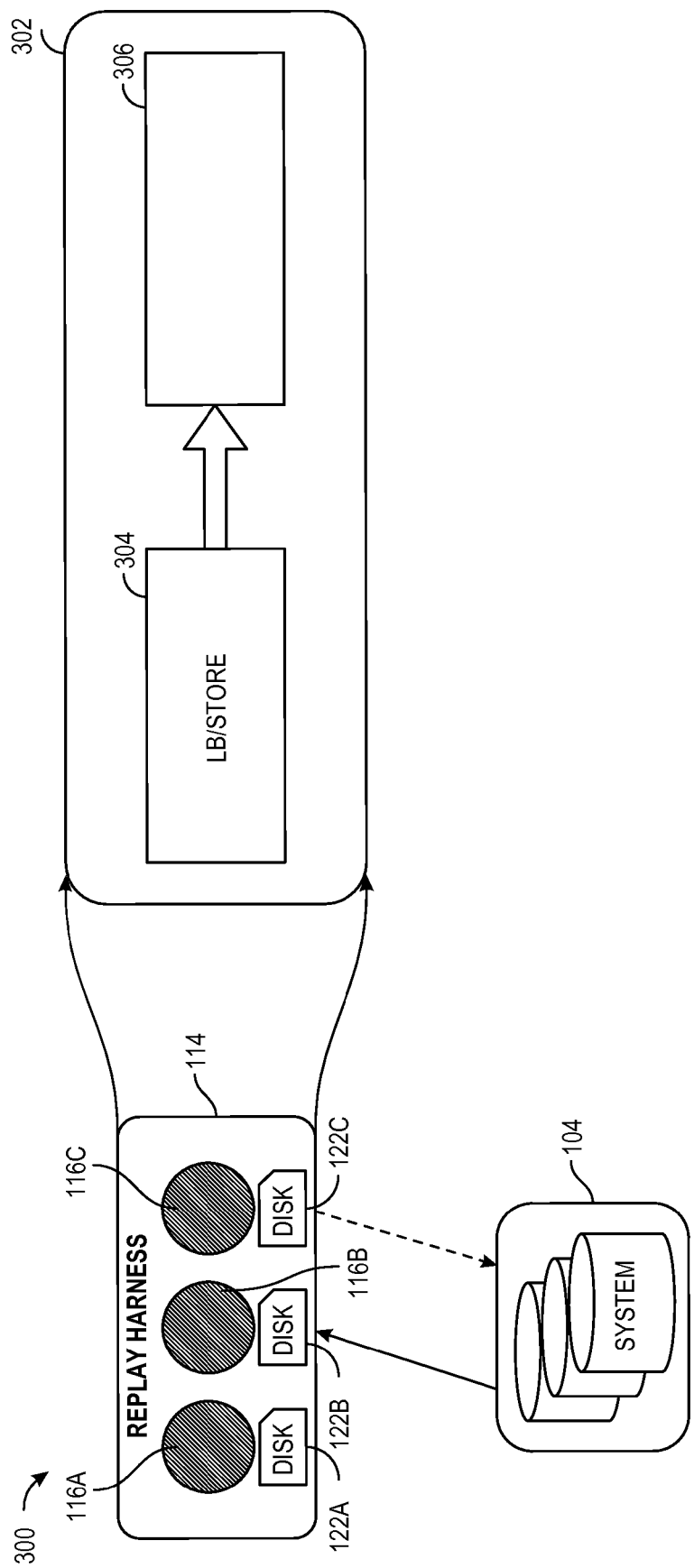
FIG. 3 is a block diagram illustrating a system, in accordance with an example embodiment, for collecting and using log data from a replay harness.

FIG. 3 is a block diagram illustrating a system 300, in accordance with an example embodiment, for collecting and using log data from a replay harness 114. The system 300 may work in conjunction with the system 100 of FIG. 1. Specifically, a log agent 302 may obtain data from the log files 122A-122C of FIG. 1, and store the data in a data store 304. A log collector, translator, & executor 306 may then collect the data, translate it, and perform various executions based on the translated data.

Referring back to FIG. 1, as described earlier, the DA tool 120 may be used to determine whether the replicated data from the first database 102 to the second database 104 is in a good state.

Figure 4:
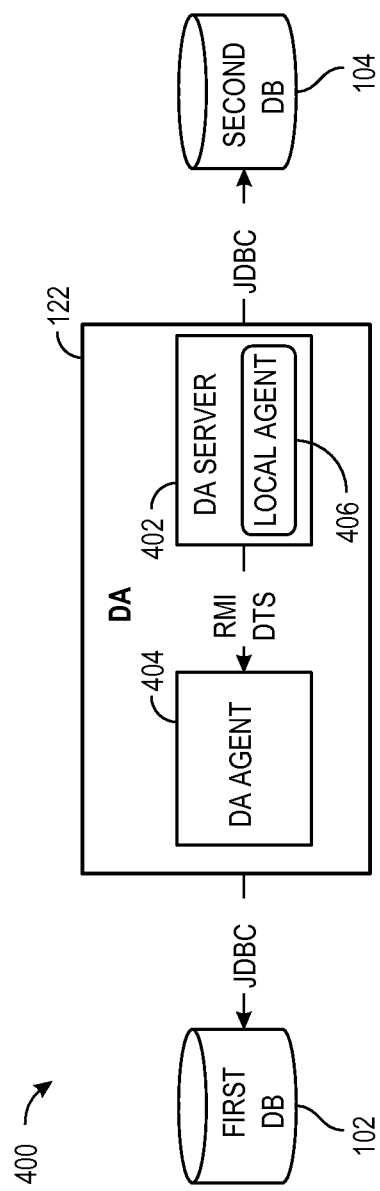
FIG. 4 is a block diagram illustrating a system, in accordance with an example embodiment, including a DA tool.

FIG. 4 is a block diagram illustrating a system 400, in accordance with an example embodiment, including a DA tool 122. The DA tool 122 may comprise a DA server 402 and a DA agent 404. The DA server 402 is where all comparisons, reconciliation, reporting, etc. occur, and it may utilize a local agent 406 for such purposes. The DA agent 404 is used to improve performance and/or scalability. This component might be installed multiple times in a distributed DA environment. As can be seen, the DA agent 404 may communicate with the first database 102 via JDBC, and likewise the local agent 406 may communicate with the second database 104 via JDBC. Communication between the DA server 402 and the DA agent 404 may be performed via Remote Method Invocation (RMI) and/or Data Transformation Service (DTS).

Data validation may include various statistic validations of the data, including finite population correction (FPC), linear quadratic (LQ), and variance performance. Periodic lightweight data validation may occur, and additional validation can occur during simulation. During simulation, lightweight data validation can be performed on critical tables.

Figure 5:
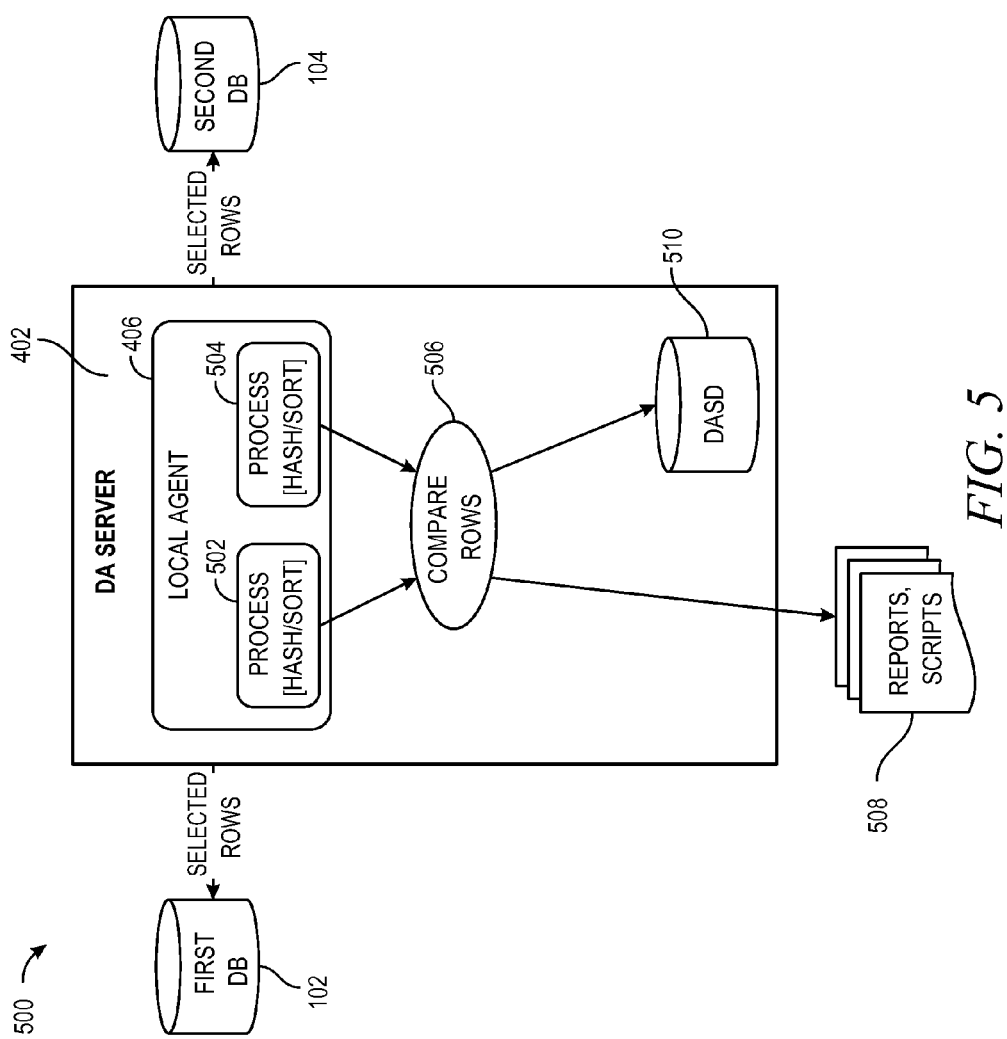
FIG. 5 is a block diagram illustrating a system, in accordance with an example embodiment, including a DA server.

FIG. 5 is a block diagram illustrating a system 500, in accordance with an example embodiment, including a DA server 404. Here, the DA server 404 includes the local agent 406, which contains a first process 502 that hashes and sorts selected rows from a source table in the first database 102 and a second process 504 that hashes and sorts selected rows from a target table in the second database 104. The source table and the target table are usually the same table stored in the different databases 102, 104 (or at least what the local agent 406 believes are the same table). The DA server 404 then compares the selected rows in a third process 506, which generates reports and/or scripts 508 describing any variances that might occur, and stores the results in a direct-access storage device (DASD) 510.

In addition to assuring the consistency of the data between the first database 102 and the second database 104 during the replication stage, the DA tool 122 can also act to periodically perform a data consistency check during the replay by the replay harness 114. If a problem occurs, this allows the replay to be stopped accordingly.

As described earlier with reference to FIG. 1, the replay harness 114 may generate its own reports and/or scripts based on the outcome of the simulator processes 116-116C. These reports may include, for example, various metrics providing insight into the sizing and capacity of the second database 104, schema packing, and slow queries. Slow queries can be broken down according to the causes of the slow queries, including, for example, deadlocks, node failures, connection and master node problems, scale problems, and schema packing. A replay exercise report can be generating showing SQL Response times, SQL Result counts and result set counts, failure reports, and replay harness health reports.

Figure 6:
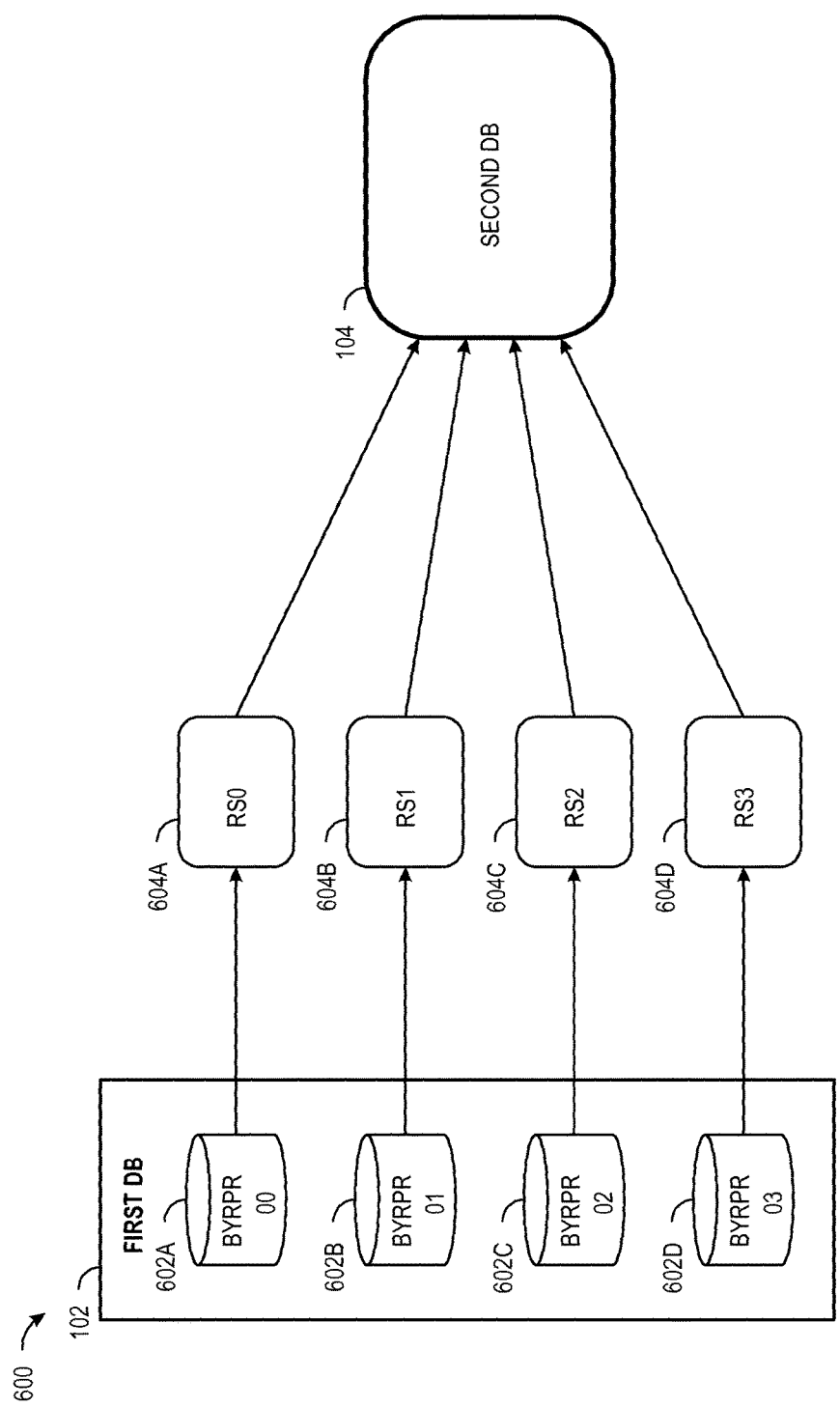
FIG. 6 is a block diagram illustrating a system, in accordance with an example embodiment, for replication services.

Additionally, referring back to FIG. 1, in an example embodiment, the replication service 118 may be implemented as multiple different replication service servers. For example, in one example embodiment, each different database server (as indicated by a database server identification (SID)) is provided its own SRS server. FIG. 6 is a block diagram illustrating a system 600, in accordance with an example embodiment, for replication services. The first database 102 includes multiple databases 602A-602D, each identified by a different SID. Each of these multiple databases 602A-602D has its own replication service server 604A-604D, which performs replication of the respective database 602A-602D to the second database 104.

As described above, the replay harness 114 acts to collect SQL event logs from application nodes and replays them to a second database. The simulator processes 116A-116C may be grouped into one or more simulator clusters. The simulator clusters collect the JDBC event logs from the application nodes. Each simulator cluster can replay events from the application nodes with a preset time delay. In an example embodiment, this may be performed by adjusting a cluster time with a fixed delay. This causes the simulator cluster to play past production events at the current time. This preset delay serves two purposes. The first is that it gives some room for out-of-order events to be collected before they are executed in order. The second is that replay service replication after initial materialization can go into an incremental update mode. This incremental update may have some latency in updating the second database in time. The service replication can be stopped before the simulator clusters begin to simulate. Setting the cluster time with a delay helps ensure that the simulator cluster plays the events from the past, and thus helps ensure that crucial database updates are not missed due to the replay service latency.

Figure 7:
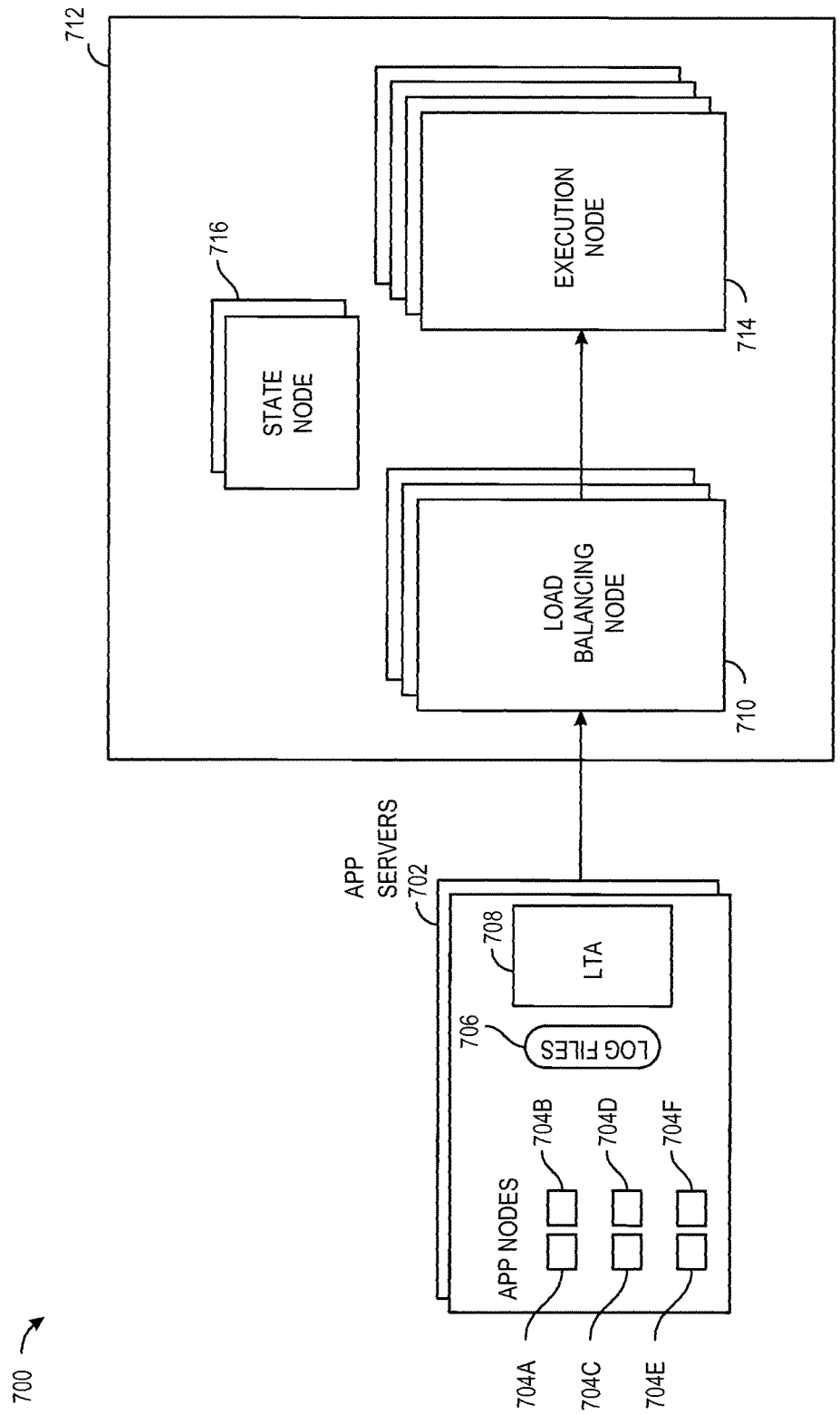
FIG. 7 is a block diagram illustrating a system, in accordance with an example embodiment, for trapping data from an application server.

FIG. 7 is a block diagram illustrating a system 700, in accordance with an example embodiment, for trapping data from an application server 702. The application server 702 is a physical production application server host where application nodes 704A-704F run. Each application node 704A-704F adds to a SQL event log file 706. A log tailer agent (LTA) 708 inside each application server 702 trails the SQL event log file 706 and sends the events to a load balancing node 710 of a simulator cluster 712. Each simulator cluster 712 is a group of processes including the load balancing node 710, an execution node 714, and a state node 716. In an example embodiment, the log tailer agent 708 reads events from the log file 706 and sends the events in batches to the load balancing node 710 using a round robin algorithm. The load balancing node 710 forwards events it receives to the execution node 714 based on availability. The execution node 714 is responsible for storing and executing events belonging to a set of communities. The state node 716 maintains state information and configuration for the simulator cluster 712.

Forwarding events based on community helps isolate the flow based on community which in turn helps isolate delays and failures by a community. Store and execute for events belonging to a community can be performed by a single execution node 714. Isolating the execution this way will help to ensure that if an execution node 714 is lagging behind or crashed, then the execution of the whole community is lagged or stopped.

Figure 8:
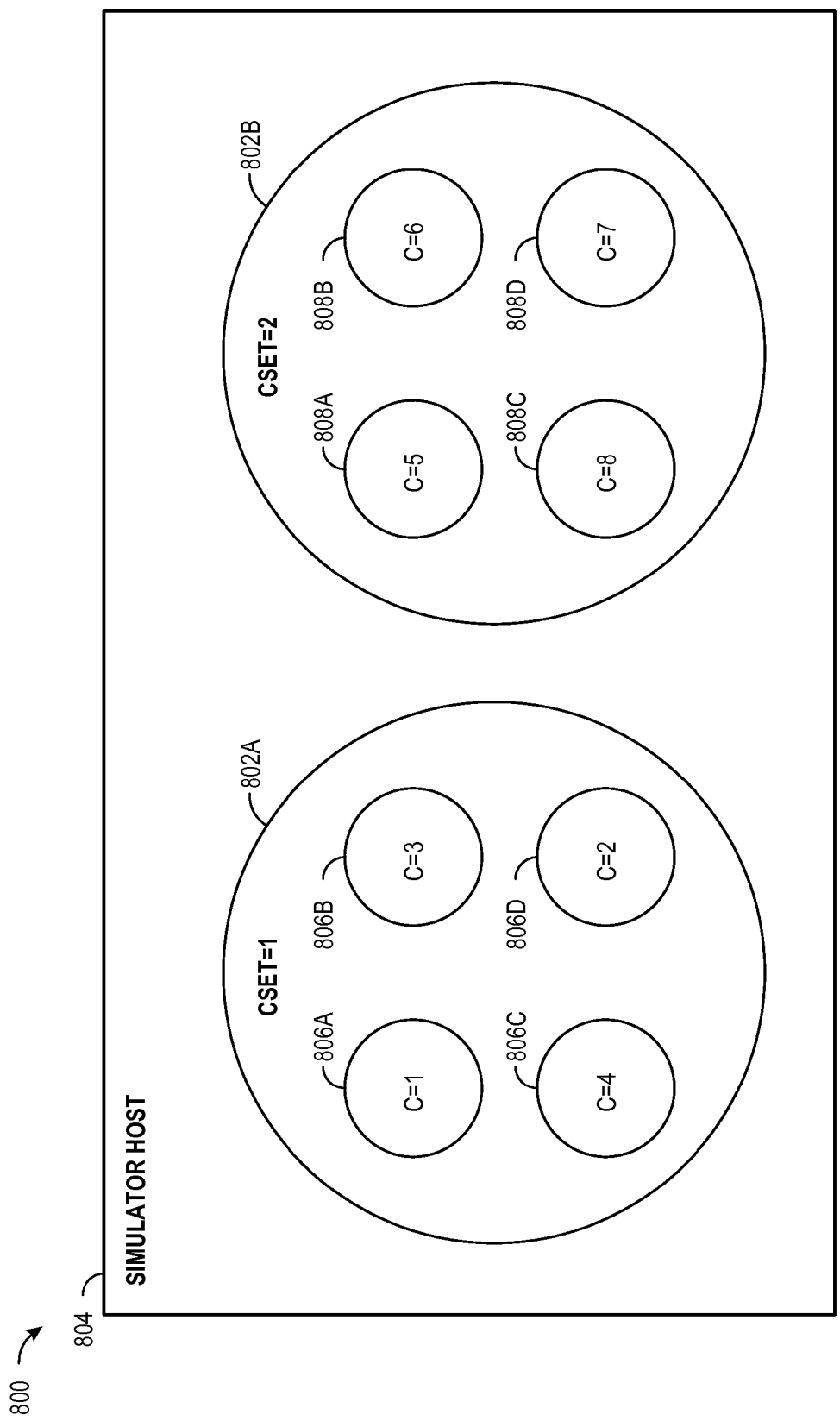
FIG. 8 is a block diagram illustrating a system, in accordance with an example embodiment, with multiple CSets.

A CSet is a set of communities to be handled by a single execution node 714. The simulator host is responsible for the set of CSets. Bin packing algorithms can be employed to pack communities into the CSet based on each community's throughput. FIG. 8 is a block diagram illustrating a system 800, in accordance with an example embodiment, with multiple CSets 802A, 802B. As can be seen, the CSets 802A, 802B are both owned by a simulator host 804. Each CSet 802A, 802B contains its own set of communities (communities 806A-806D for CSet 802A and communities 808A-808D for CSet 802B).

Figure 9:
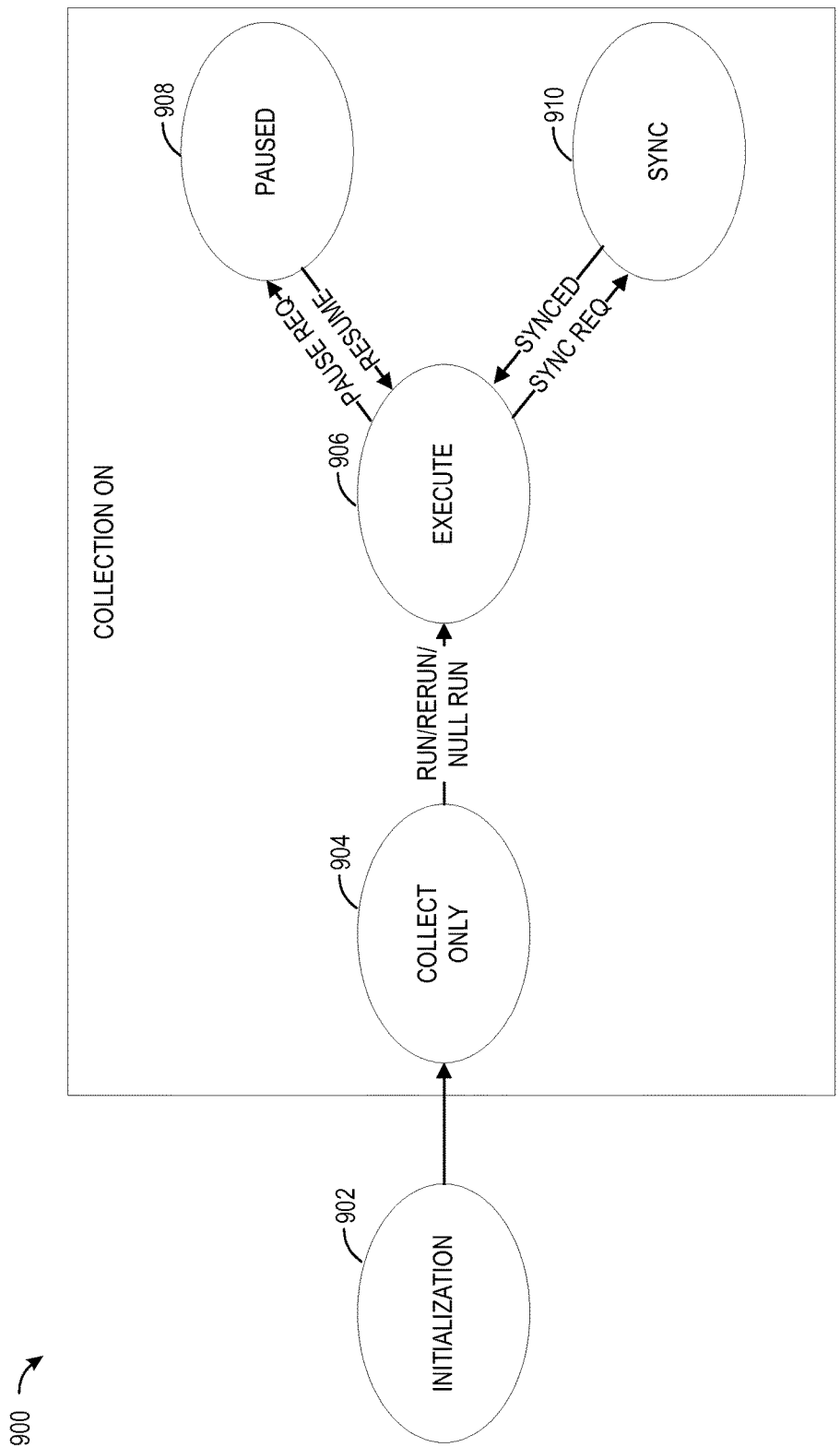
FIG. 9 is a flow diagram illustrating a method, in accordance with an example embodiment, for progressing through simulator cluster states.

FIG. 9 is a flow diagram illustrating a method 900, in accordance with an example embodiment, for progressing through simulator cluster states. On startup, the simulator cluster progresses to an initialization state 902. After initialization, the simulator cluster progresses to a collect-only state 904, where event collection is performed. Then the simulator cluster progresses to an execute state 906 (based on a command to run, rerun, or null run). This begins the replay process. At any point, the execution may be paused, progressing the simulator cluster to a paused state 908. Additionally, when a node in the simulator cluster lags more than a predefined amount, synchronization may occur at a synchronization state 910.

Referring back to FIG. 7, the load balancing node 710 is responsible for splitting events received into CSets and sending the events for a CSet to an appropriate execution node 714 that is responsible for the CSet. The load balancing node 710 can perform this by obtaining a community-to-Cset mapping from the state node 716. The load balancing node 710 then obtains a CSet-to-execution-node mapping. It can then create an internal cache which maintains the mappings. It continues to listen for any updates to keep the cache updated with changes.

Queries can be converted before being stored. This conversion may be from the language of the first database (e.g, SQL) to a language compatible with the second database.

The execution node 714 can read the stored events for the CSet it is responsible for and send the events to a delayed priority queue. Based on the cluster time, a time slot file can be picked, and the size of the file can help determine if sufficient space is available in the delayed priority queue. If sufficient space is available to put all the events in the time slot, then the events can be loaded to the delayed priority queue. If sufficient space is not available to accommodate the whole file and the cluster time indicates that the events are due for execution, the time slot file can be externally sorted based on load. The sorted file then can be stream loaded into the delayed priority queue based on the sorted order if and when the space is available.

For execution, there may be an expandable worker thread pool with a maximum limit set. The expandable worker thread pool can watch the delayed priority queue to execute events when they are due for execution. The event can be executed when the simulator clock is equal to the event time. When a worker thread receives a due event, it requests a connection from the connection pool, providing the connection identification from the event. When the connection is returned by the connection pool, the worker thread can execute the JDBC statements against the connection and log the report of the executed statement.

The worker thread may execute the event using three steps. In the first step, the second database connection for the connection identification mentioned in the event is retrieved. In the second step, the events are executed according to the timestamp of each statement. In the third step, statistics are collected and made available in a file corresponding to the node.

A connection pool in the execution node 714 can have one connection for each connection to the first database. A map between the first database connection identification and the second database connection identification can be maintained. The second database connections can be created on demand when there is no second database connection corresponding to the first database connection identification present in the event. This is a four step process:

(1) Check if the second database connection exists for the first database.

(2) If the connection does not exist, then create a new connection, map it, and return to the caller.

(3) If it does exist, then check if the connection is free on the pool, and if so then return to the caller.

(4) If the connection exists but is not in the pool, then wait until the connection is available in the pool for the calling thread.

This process helps ensure that the statements executed on the first database connection are executed in sequence.

In an example embodiment, the number of execution nodes on the simulator host will be one greater than the number of CSets the host is responsible for. The extra execution nodes are available as a standby to take responsibility for a CSet when an execution node fails. This helps ensure high availability.

The following are examples of items that can be cumulatively reported for each CSET:

1. Cumulative second database execution latency in seconds;

2. Cumulative error (total number of errors);

3. Cumulative number of SQL commands whose result set count did not match between the first and second databases.

Figure 10:
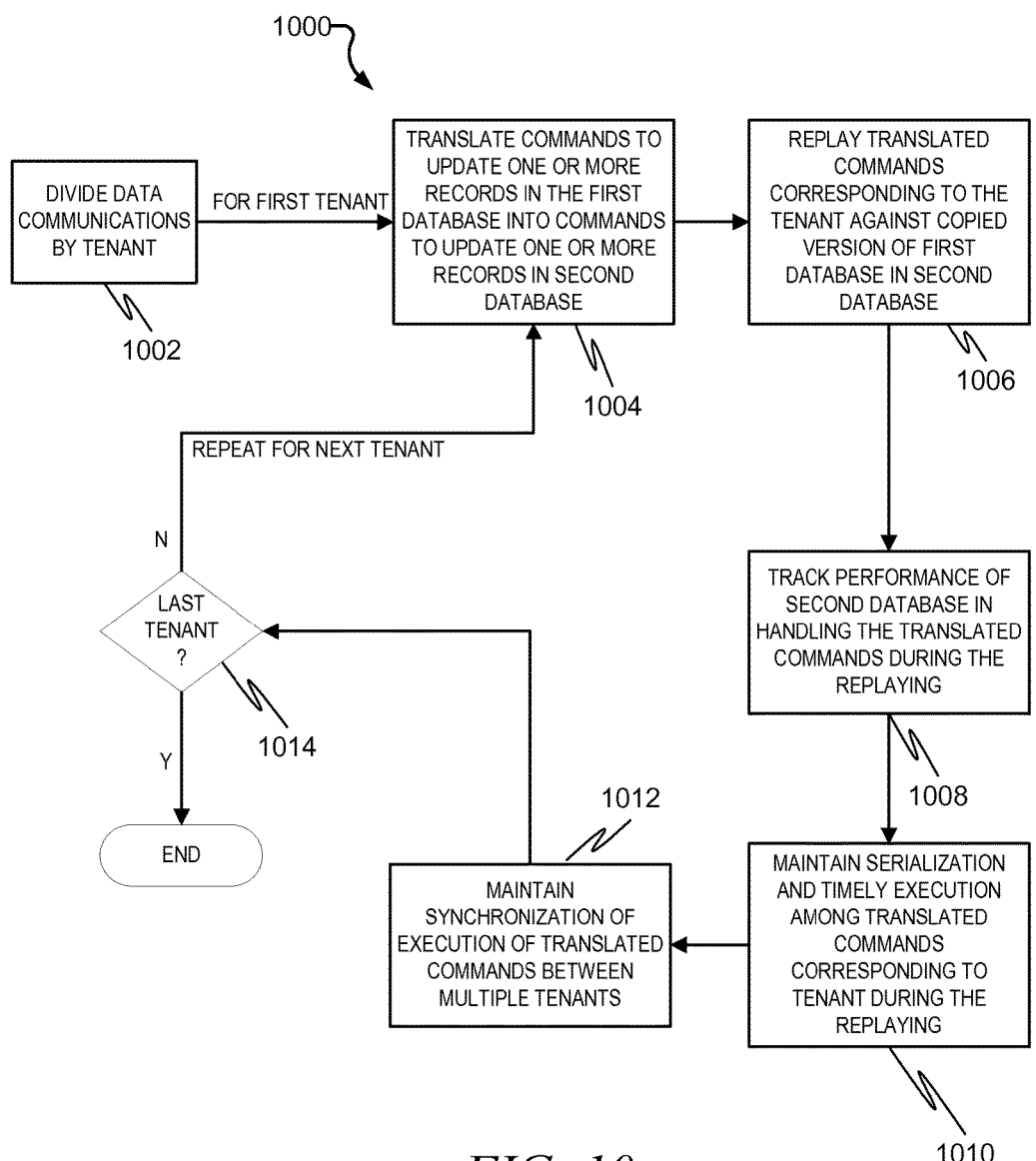
FIG. 10 is a flow diagram illustrating a method, in accordance with an example embodiment, of intercepting data communications between a software application and a first database.

FIG. 10 is a flow diagram illustrating a method 1000, in accordance with an example embodiment, of intercepting data communications between a software application and a first database. The data communications may comprise commands to update one or more records in the first database, the software application serving multiple tenants sharing a single instance of the software application. At operation 1002, the data communications are divided based on tenant. This dividing may be accomplished by, for example, intercepting the data communications for different tenants separately, or by accessing metadata within the data communications to identify a tenant for each data communication. After operation 1002, a loop is performed for each tenant of the multiple tenants. At operation 1004, the commands within the data communications corresponding to the tenant to update one or more records in the first database are translated into commands to update one or more records in a second database of a different type than the first database. At operation 1006, the translated commands corresponding to the tenant are replayed against a copied version of the first database in the second database, causing updating of the one or more records in the second database. At operation 1008, performance of the second database in handling the translated commands is tracked during the replaying. At operation 1010, serialization and timely execution, among the translated commands corresponding to the tenant, of execution of the translated commands is maintained during the replaying. At operation 1012, synchronization of execution of translated commands between multiple tenants is maintained. At operation 1014, it is determined if this is the last tenant of the multiple tenants. If not, then the method 1000 loops back to operation 1004 with a different tenant. If so, then the method 1000 ends.

Example Mobile Device

Figure 11:
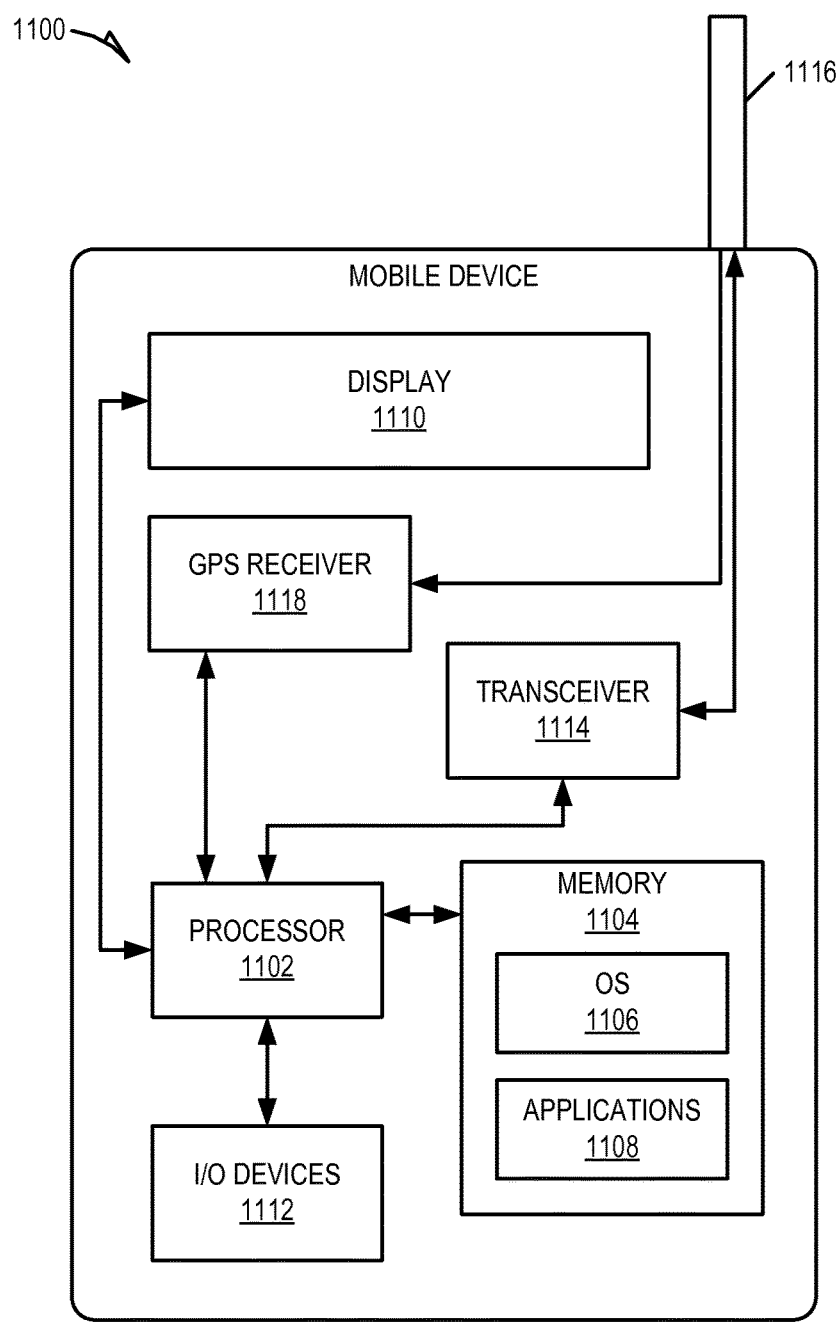
FIG. 11 is a block diagram illustrating a mobile device, according to an example embodiment.

FIG. 11 is a block diagram illustrating a mobile device 1200, according to an example embodiment. The mobile device 1200 may include a processor 1202. The processor 1202 may be any of a variety of different types of commercially available processors 1202 suitable for mobile devices 1200 (for example, an XScale architecture microprocessor, a microprocessor without interlocked pipeline stages (MIPS) architecture processor, or another type of processor 1202). A memory 1204, such as a random access memory (RAM), a flash memory, or another type of memory, is typically accessible to the processor 1202. The memory 1204 may be adapted to store an operating system (OS) 1206, as well as application programs 1208, such as a mobile location-enabled application that may provide location-based services to a user. The processor 1202 may be coupled, either directly or via appropriate intermediary hardware, to a display 1210 and to one or more input/output (I/O) devices 1212, such as a keypad, a touch panel sensor, a microphone, and the like. Similarly, in some embodiments, the processor 1202 may be coupled to a transceiver 1214 that interfaces with an antenna 1216. The transceiver 1214 may be configured to both transmit and receive cellular network signals, wireless data signals, or other types of signals via the antenna 1216, depending on the nature of the mobile device 1200. Further, in some configurations, a GPS receiver 1218 may also make use of the antenna 1216 to receive GPS signals.

Modules, Components and Logic

Certain embodiments are described herein as including logic or a number of components, modules, or mechanisms. Modules may constitute either software modules (e.g., code embodied (1) on a non-transitory machine-readable medium or (2) in a transmission signal) or hardware-implemented modules. A hardware-implemented module is a tangible unit capable of performing certain operations and may be configured or arranged in a certain manner. In example embodiments, one or more computer systems (e.g., a standalone, client, or server computer system) or one or more processors (e.g., processor 1202) may be configured by software (e.g., an application or application portion) as a hardware-implemented module that operates to perform certain operations as described herein.

In various embodiments, a hardware-implemented module may be implemented mechanically or electronically. For example, a hardware-implemented module may comprise dedicated circuitry or logic that is permanently configured (e.g., as a special-purpose processor, such as a field programmable gate array (FPGA) or an application-specific integrated circuit (ASIC)) to perform certain operations. A hardware-implemented module may also comprise programmable logic or circuitry (e.g., as encompassed within a general-purpose processor or another programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Accordingly, the term "hardware-implemented module" should be understood to encompass a tangible entity, be that an entity that is physically constructed, permanently configured (e.g., hardwired), or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses that connect the hardware-implemented modules). In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation, and store the output of that operation in a memory device to which it is communicatively coupled. A further hardware-implemented module may then, at a later time, access the memory device to retrieve and process the stored output. Hardware-implemented modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., APIs).

Electronic Apparatus and System

Example embodiments may be implemented in digital electronic circuitry, or in computer hardware, firmware, or software, or in combinations of them. Example embodiments may be implemented using a computer program product, e.g., a computer program tangibly embodied in an information carrier, e.g., in a machine-readable medium for execution by, or to control the operation of, data processing apparatus, e.g., a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry, e.g., an FPGA or an ASIC.

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice. Below are set out hardware (e.g., machine) and software architectures that may be deployed, in various example embodiments.

Example Machine Architecture and Machine-Readable Medium

Figure 12:
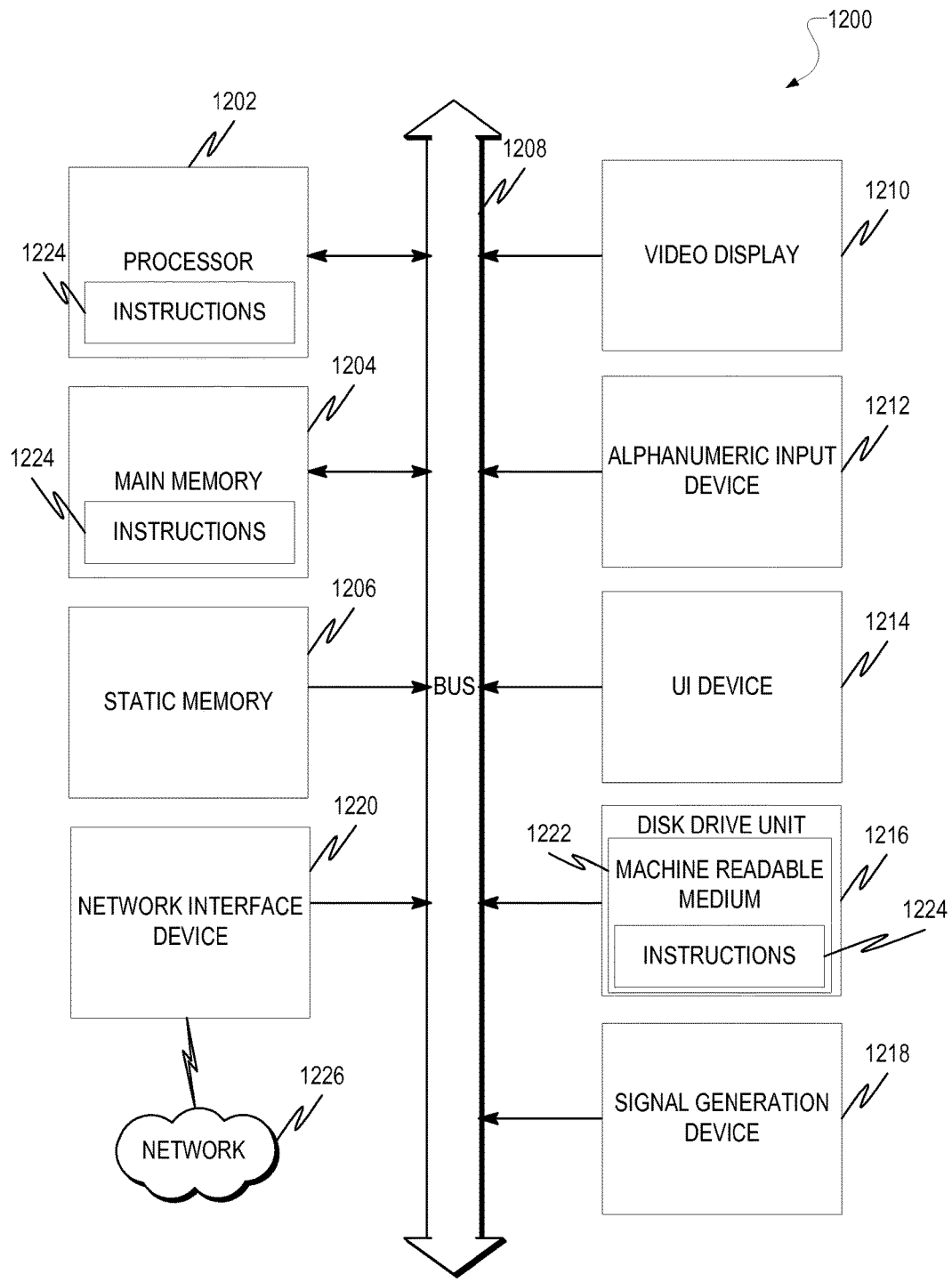
FIG. 12 is a block diagram of machine in the example form of a computer system within which instructions may be executed for causing the machine to perform any one or more of the methodologies discussed herein.

FIG. 12 is a block diagram of machine in the example form of a computer system 1200 within which instructions 1224 may be executed for causing the machine to perform any one or more of the methodologies discussed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a personal digital assistant (PDA), a cellular telephone, a web appliance, a network router, switch, or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1200 includes a processor 1202 (e.g., a central processing unit (CPU), a graphics processing unit (GPU), or both), a main memory 1204, and a static memory 1206, which communicate with each other via a bus 1208. The computer system 1200 may further include a video display unit 1210 (e.g., a liquid crystal display (LCD) or a cathode ray tube (CRT)). The computer system 1200 also includes an alphanumeric input device 1212 (e.g., a keyboard or a touch-sensitive display screen), a user interface (UI) navigation (or cursor control) device 1214 (e.g., a mouse), a disk drive unit 1216, a signal generation device 1218 (e.g., a speaker), and a network interface device 1220.

Machine-Readable Medium

The disk drive unit 1216 includes a machine-readable medium 1222 on which is stored one or more sets of data structures and instructions 1224 (e.g., software) embodying or utilized by any one or more of the methodologies or functions described herein. The instructions 1224 may also reside, completely or at least partially, within the main memory 1204 and/or within the processor 1202 during execution thereof by the computer system 1200, with the main memory 1204 and the processor 1202 also constituting machine-readable media 1222.

While the machine-readable medium 1222 is shown in an example embodiment to be a single medium, the term "machine-readable medium" may include a single medium or multiple media (e.g., a centralized or distributed database, and/or associated caches and servers) that store the one or more instructions 1224 or data structures. The term "machine-readable medium" shall also be taken to include any tangible medium that is capable of storing, encoding, or carrying instructions 1224 for execution by the machine and that cause the machine to perform any one or more of the methodologies of the present disclosure, or that is capable of storing, encoding, or carrying data structures utilized by or associated with such instructions 1224. The term "machine-readable medium" shall accordingly be taken to include, but not be limited to, solid-state memories, and optical and magnetic media. Specific examples of machine-readable media 1222 include non-volatile memory, including by way of example semiconductor memory devices, e.g., erasable programmable read-only memory (EPROM), electrically erasable programmable read-only memory (EEPROM), and flash memory devices; magnetic disks such as internal hard disks and removable disks; magneto-optical disks; and CD-ROM and DVD-ROM disks.

Transmission Medium

The instructions 1224 may further be transmitted or received over a communications network 1226 using a transmission medium. The instructions 1224 may be transmitted using the network interface device 1220 and any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., WiFi and WiMax networks). The term "transmission medium" shall be taken to include any intangible medium that is capable of storing, encoding, or carrying instructions 1224 for execution by the machine, and includes digital or analog communications signals or other intangible media to facilitate communication of such software.

Although an embodiment has been described with reference to specific example embodiments, it will be evident that various modifications and changes may be made to these embodiments without departing from the broader spirit and scope of the disclosure. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A method comprising:
   intercepting data communications between a software application and a first database, the data communications comprising commands to update one or more records in the first database, the software application serving multiple tenants sharing a single instance of the software application;
   timestamping each of the commands as each of the commands is intercepted, producing a timestamp as metadata for each of the commands;
   dividing, using the at least one hardware processor, the data communications based on tenant; and
   for each tenant of the multiple tenants:
   translating the commands, using the at least one hardware processor, to update the one or more records in the first database within the data communications corresponding to the tenant into commands to update one or more records in a second database of a different type than the first database;
   determining, using the at least one hardware processor, that the commands for the tenant are directed to multiple processes for the tenant;
   based on the determining, creating a replay ordering for the tenant, the replay ordering being a strict ordering based on the timestamps for commands for the tenant among the multiple processes, without regard for the timestamps for commands for tenants other than the tenant;
   replaying, using the replay ordering, the translated commands corresponding to the tenant against a copied version of the first database in the second database, causing updating of the one or more records in the second database;
   tracking performance of the second database in handling the translated commands during the replaying, the tracking including measuring load performance of the second database as well as determining whether differences between the first database and the second database are constant or decreasing;
   maintaining serialization and timely execution, among the translated commands corresponding to the tenant, of execution of the translated commands during the replaying; and
   maintaining synchronization of execution of translated commands between multiple tenants.

2. The method of claim 1, wherein the dividing occurs by intercepting the data communications for different tenants separately.

3. The method of claim 1, wherein the dividing is performed by accessing metadata within the data communications, the metadata identifying a tenant for each data communication.

4. The method of claim 1, wherein the commands to update the one or more records in the first database are in a first database language and the translating comprises translating the commands in the first database language to a second database language compatible with the second database.

5. The method of claim 1, wherein the first database is a row-based database while the second database is a column-based database.

6. The method of claim 1, wherein the replaying includes distributing replay among coordination services capable of coordination with each other through a shared hierarchical namespace.

7. The method of claim 1, wherein the maintaining synchronization includes implementing automatic pause and resume for any simulator processes.

8. A system comprising:
   a hardware processor;
   a memory;
   a first database;
   a second database having a different database type than the first database;
   a replication service configured to copy data from the first database to the second database;
   an application server serving a plurality of tenants and configured to send commands to the first database to update one or more records in the first database;
   a log taller agent configured to intercept the commands sent from the application server to the first database and timestamp each of the commands as each of the commands is intercepted, producing a timestamp as metadata for each of the commands; and
   a replay harness configured to divide the commands based on tenant by assigning commands for each particular tenant to one or more simulator processes dedicated to that particular tenant, each of the one or more simulator processes dedicated to a particular tenant configured to:
   translate the commands corresponding to the particular tenant to update the one or more records in the first database into commands to update one or more records in the second database;
   determine that the commands for the tenant are directed to multiple processes for the tenant;
   based on the determining, create a replay ordering for the tenant, the replay ordering being a strict ordering based on the timestamps for commands for the tenant among the multiple processes, without regard for the timestamps for the commands for tenants other than the tenant;
   replay, using the replay ordering, the translated commands corresponding to the particular tenant against the copied data in the second database, causing updating of the one or more records in the second database;
track performance of the second database in handling the translated commands during the replaying, the tracking including measuring load performance of the second database as well as determining whether differences between the first database and the second database are constant or decreasing;
maintain serialization and timely execution, among the translated commands corresponding to the tenant, of execution of the translated commands during the replaying; and
maintain synchronization of execution of translated commands between multiple tenants.

9. The system of claim 8, further comprising a data assurance component configured to assure that data in the first database is consistent with data in the second database.

10. The system of claim 8, wherein the dividing occurs by intercepting the commands for different tenants separately.

11. The system of claim 8, wherein the dividing is performed by accessing metadata accompanying the commands, the metadata identifying a tenant for each data communication.

12. The system of claim 8, wherein the commands to update the one or more records in the first database are in a first database language and the translating comprises translating the commands in the first database language to a second database language compatible with the second database.

13. The system of claim 8, wherein the first database is a row-based database while the second database is a column-based database.

14. A non-transitory machine-readable storage medium comprising instructions, which when implemented by one or more machines, cause the one or more machines to perform operations comprising:
intercepting data communications between a software application and a first database, the data communications comprising commands to update one or more records in the first database, the software application serving multiple tenants sharing a single instance of the software application;
timestamping each of the commands as each of the commands is intercepted, producing a timestamp as metadata for each of the commands;
dividing the data communications based on tenant; and
for each tenant of the multiple tenants:
translating the commands to update the one or more records in the first database within the data communications corresponding to the tenant into commands to update one or more records in a second database of a different type than the first database;
determining that the commands for the tenant are directed to multiple processes for the tenant;
based on the determining, creating a replay ordering for the tenant, the replay ordering being a strict ordering based on the timestamps for commands for the tenant among the multiple processes, without regard for the timestamps for commands for tenants other than the tenant;
replaying, using the replay ordering, the translated commands corresponding to the tenant against a copied version of the first database in the second database, causing updating of the one or more records in the second database;
tracking performance of the second database in handling the translated commands during the replaying, the tracking including measuring load performance of the second database as well as determining whether differences between the first database and the second database are constant or decreasing;
maintaining serialization and timely execution, among the translated commands corresponding to the tenant, of execution of the translated commands during the replaying; and
maintaining synchronization of execution of translated commands between multiple tenants.

15. The non-transitory machine-readable storage medium of claim 14, wherein the dividing occurs by intercepting the data communications for different tenants separately.

16. The non-transitory machine-readable storage medium of claim 14, wherein the dividing is performed by accessing metadata within the data communications, the metadata identifying a tenant for each data communication.

17. The non-transitory machine-readable storage medium of claim 14, wherein the commands to update the one or more records in the first database are in a first database language and the translating comprises translating the commands in the first database language to a second database language compatible with the second database.

18. The non-transitory machine-readable storage medium of claim 14, wherein the first database is a row-based database while the second database is a column-based database.

19. The non-transitory machine-readable storage medium of claim 14, wherein the replaying includes distributing replay among coordination services capable of coordination with each other through a shared hierarchical namespace.

20. The non-transitory machine-readable storage medium of claim 14, wherein the maintaining synchronization includes implementing automatic pause and resume for any simulator processes.

* * * * *